(12) United States Patent
Cho et al.

(10) Patent No.: US 11,293,948 B2
(45) Date of Patent: Apr. 5, 2022

(54) SYSTEM AND METHOD FOR CORRECTING CURRENT VALUE OF SHUNT RESISTOR

(71) Applicant: LG Chem, Ltd., Seoul (KR)

(72) Inventors: Hyunki Cho, Daejeon (KR); Jaedong Park, Daejeon (KR)

(73) Assignee: LG Energy Solution, Ltd.

( * ) Notice: Subject to any disclaimer, the term of this patent is extended or adjusted under 35 U.S.C. 154(b) by 15 days.

(21) Appl. No.: 16/955,124

(22) PCT Filed: Aug. 26, 2019

(86) PCT No.: PCT/KR2019/010830
§ 371 (c)(1),
(2) Date: Jun. 18, 2020

(87) PCT Pub. No.: WO2020/045915
PCT Pub. Date: Mar. 5, 2020

(65) Prior Publication Data
US 2020/0386788 A1 Dec. 10, 2020

(30) Foreign Application Priority Data
Aug. 31, 2018 (KR) .................. 10-2018-0103671

(51) Int. Cl.
*G01R 1/20* (2006.01)
*G01R 15/14* (2006.01)
(Continued)

(52) U.S. Cl.
CPC ........... *G01R 1/203* (2013.01); *G01R 15/144* (2013.01); *G01R 15/146* (2013.01); *G01R 19/32* (2013.01); *G01R 35/005* (2013.01)

(58) Field of Classification Search
CPC .... G01R 1/203; G01R 15/144; G01R 15/146; G01R 19/32; G01R 35/005; G01R 35/00
(Continued)

(56) References Cited

U.S. PATENT DOCUMENTS

2005/0017760 A1  1/2005  Grasso et al.
2014/0015515 A1  1/2014  Satou
(Continued)

FOREIGN PATENT DOCUMENTS

CN  107589291 A  1/2018
CN  107728094 A  2/2018
(Continued)

OTHER PUBLICATIONS

International Search Report from Application No. PCT/KR2019/010830 dated Dec. 4, 2019, 2 pages.
(Continued)

*Primary Examiner* — Tung X Nguyen
*Assistant Examiner* — Robert P Alejnikov, Jr.
(74) *Attorney, Agent, or Firm* — Lerner, David, Littenberg, Krumholz & Mentlik, LLP

(57) ABSTRACT

A system and a method for correcting a current value of a shunt resistor, which calculate a change amount of a resistance value by using a variable temperature value of a shunt resistor and calculate a real-time current value flowing in the corresponding shunt resistor based on the calculated change amount of the resistance value and voltage values of both terminals of the shunt resistor, so that even though the temperature value of the shunt resistor is continuously changed, an accurate current value may be obtained by reflecting all the changes.

13 Claims, 2 Drawing Sheets

(51) Int. Cl.
  *G01R 19/32*   (2006.01)
  *G01R 35/00*   (2006.01)
(58) Field of Classification Search
  USPC .......................................................... 324/126
  See application file for complete search history.

(56) References Cited

U.S. PATENT DOCUMENTS

| | | |
|---|---|---|
| 2015/0219690 A1 | 8/2015 | Kaya |
| 2016/0372954 A1 | 12/2016 | Kageyama et al. |
| 2017/0254839 A9 | 9/2017 | Draxelmayr et al. |
| 2021/0072336 A1 | 3/2021 | Hou et al. |

FOREIGN PATENT DOCUMENTS

| | | |
|---|---|---|
| DE | 102009034448 A1 | 3/2010 |
| EP | 2837941 A1 | 2/2015 |
| JP | H055758 A | 1/1993 |
| JP | 2008198431 A | 8/2008 |
| JP | 2012220249 A | 11/2012 |
| JP | 201796694 A | 6/2017 |
| JP | 2018025446 A | 2/2018 |
| JP | 2018037332 A | 3/2018 |
| KR | 100618569 B1 | 8/2006 |
| KR | 20140095285 A | 8/2014 |
| KR | 101686485 B1 | 12/2016 |

OTHER PUBLICATIONS

Extended European Search Report for Application No. 19856200.1 dated Mar. 15, 2021, 3 pages.

[Figure 1]
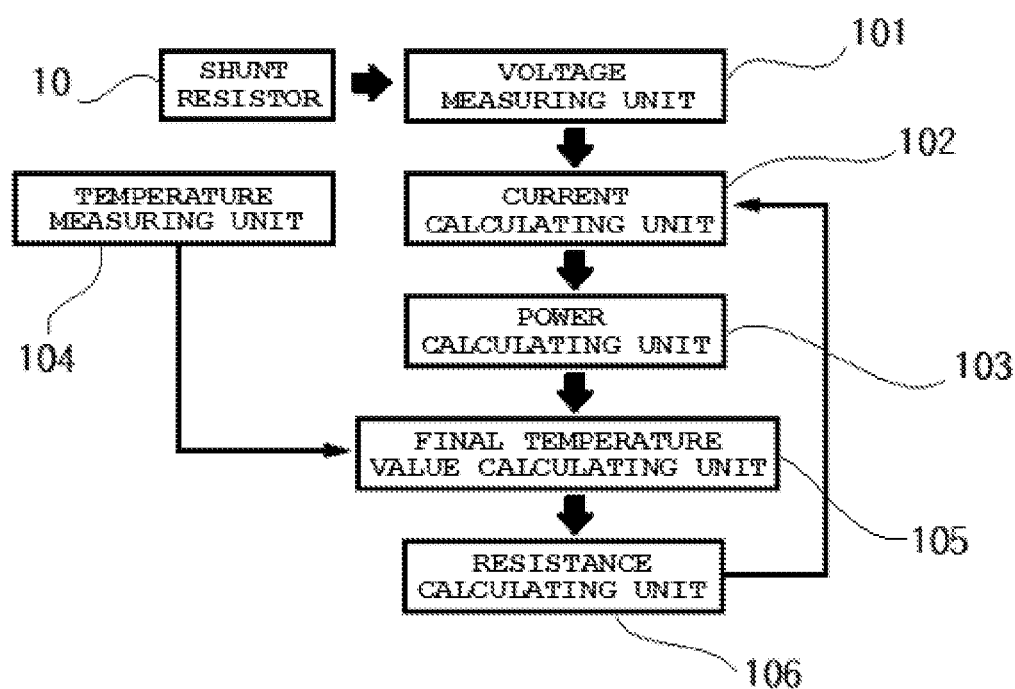

[Figure 2]
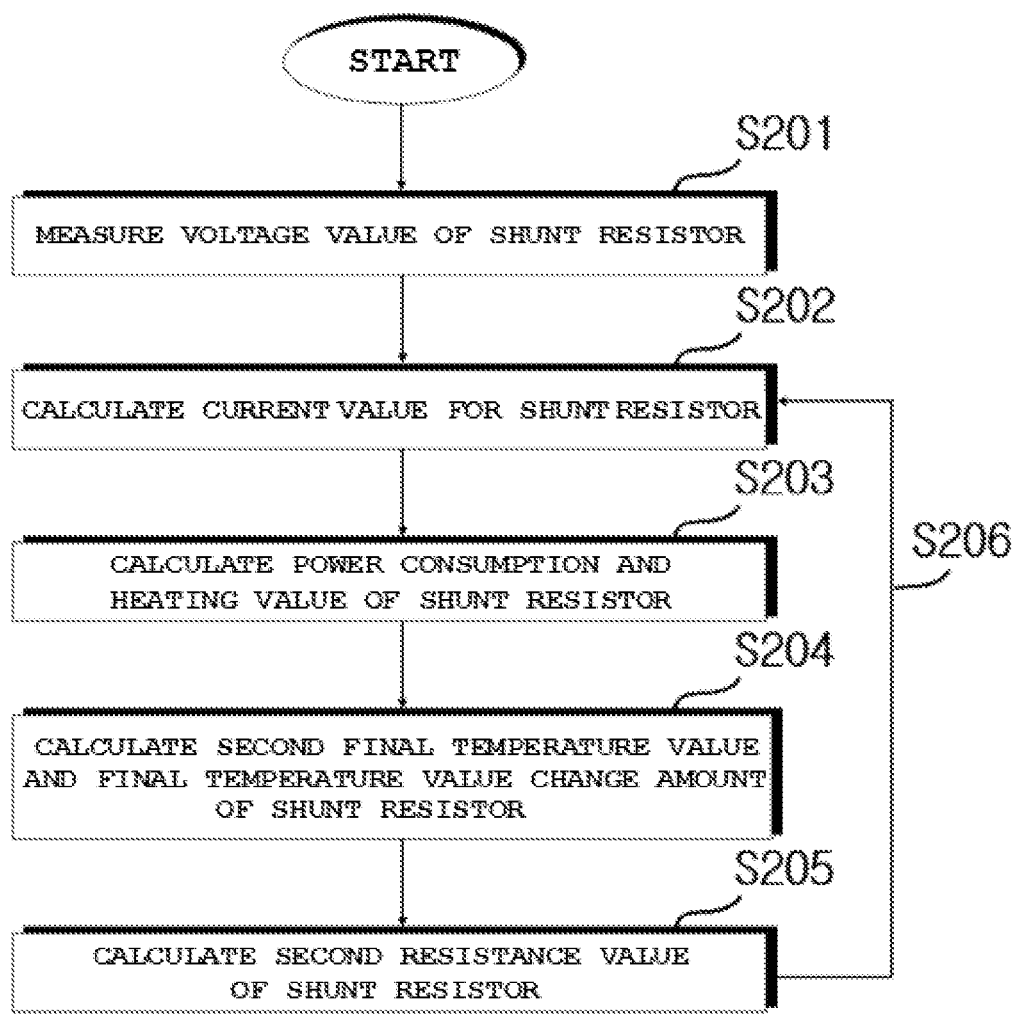

SYSTEM AND METHOD FOR CORRECTING CURRENT VALUE OF SHUNT RESISTOR

CROSS-REFERENCE TO RELATED APPLICATIONS

The present application is a national phase entry under 35 U.S.C. § 371 of International Application No. PCT/KR2019/010830 filed Aug. 26, 2019, published in Korean, which claims priority from Korean Patent Application No. 10-2018-0103671 filed Aug. 31, 2018, all of which are incorporated herein by reference.

TECHNICAL FIELD

The present invention relates to a system and a method for correcting a current value of a shunt resistor, and to a system and a method for correcting a current value of a shunt resistor, which calculate a change amount of a resistance value by using a variable temperature value of a shunt resistor and calculate a real-time current value flowing in the corresponding shunt resistor based on the calculated change amount of the resistance value and voltage values of both terminals of the shunt resistor, so that even though the temperature value of the shunt resistor is continuously changed, an accurate current value may be obtained by reflecting all the changes.

BACKGROUND ART

In general, as a method of using a shunt resistor in a current system, a method of measuring a current value is used. In the method of measuring a current through the shunt resistor, a temperature of the shunt resistor is changed due to heat of the shunt resistor when a current flows, and when a change amount of a resistance value caused by the changed temperature of the shunt resistor is not considered, the measured current value may have an error.

In addition, since a temperature of the shunt resistor made of a metal is sharply changed according to a heating value due to a material characteristic, there is a problem in that it is impossible to measure a sharp change in a temperature of the shunt resistor with a general temperature sensor that has a low sensing response speed in real time.

SUMMARY

Technical Problem

The present invention is conceived to solve the problems, and an object of the present invention is to provide a system and a method for correcting a current value of a shunt resistor, which calculate a change amount of a resistance value by using a variable temperature value of a shunt resistor and calculate a real-time current value flowing in the corresponding shunt resistor based on the calculated change amount of the resistance value and voltage values of both terminals of the shunt resistor, so that even though the temperature value of the shunt resistor is continuously changed, an accurate current value may be obtained by reflecting all the changes.

Technical Solution

An exemplary embodiment of the present invention provides a system for correcting a current value of a shunt resistor, the system including: a power calculating unit configured to calculate power consumption and a heating value of a shunt resistor included in a circuit based on a current value for the shunt resistor and a first resistance value of the shunt resistor; a temperature sensor configured to measure an ambient temperature value of the shunt resistor; a final temperature value calculating unit configured to calculate (a) a final temperature value for the shunt resistor and (b) a change amount of the final temperature value compared to an initial temperature value before a flow of a current flows through the shunt resistor based on (i) a heating temperature value of the shunt resistor calculated based on the calculated heating value and a thermal resistance coefficient of the shunt resistor and (ii) the ambient temperature value of the shunt resistor; and a resistance calculating unit configured to calculate a second resistance value of the shunt resistor based on the calculated change amount of the final temperature value and a temperature coefficient value of the shunt resistor.

In the exemplary embodiment, the system may further include: a voltage sensor configured to detect a voltage value of the shunt resistor when a voltage of the shunt resistor drops; and a current calculating unit configured to calculate a current value for the shunt resistor based on the detected voltage value and the first resistance value of the shunt resistor, in which the current calculating unit may be configured to change the first resistance value to the second resistance value provided from the resistance calculating unit.

In the exemplary embodiment, the current calculating unit may be configured to calculate the current value using $$I=V/R$$

wherein, I is the current value, V is the voltage value of the shunt resistor, and R is the first resistance value of the shunt resistor.

In the exemplary embodiment, the power calculating unit may be configured to calculate the heating value of the shunt resistor using $$E=\int_0^1 (I^2 * R)dt$$

wherein, E is the heating value of the shunt resistor, I is the current value of the shunt resistor, R is the first resistance value of the shunt resistor, and t is a flowing time value of a current flowing in the shunt resistor.

In the exemplary embodiment, the final temperature calculating unit may be configured to calculate change amount of the final temperature value using $$T(E*a)+T_a-T_i$$

wherein, T is the change amount of the final temperature value, E is the heating value of the shunt resistor, a is the thermal resistance coefficient of the shunt resistor, $T_a$ is the ambient temperature of the shunt resistor, and $T_i$ is the initial temperature value of the shunt resistor.

In the exemplary embodiment, the resistance calculating unit may be configured to calculate the second resistance value of the shunt resistor using:

$$R=R_i+(T*b)$$

wherein, R is the second resistance value of the shunt resistor, $R_i$ is the first resistance value of the shunt resistor, T is the change amount of the final temperature value, and b is the temperature coefficient of the shunt resistor.

Another exemplary embodiment of the present invention provides a method for correcting a current value of a shunt resistor, the method including: calculating, by a power calculating unit, power consumption and a heating value of a shunt resistor included in a circuit based on a current value for the shunt resistor and a first resistance value of the shunt resistor; measuring, by a temperature sensor, a real-time ambient temperature of the shunt resistor; calculating, by a final temperature value calculating unit, (a) a final temperature value for the shunt resistor and (b) a change amount of the final temperature value compared to a an initial temperature value before a flow of a current flows through the shunt resistor based on (i) a heating temperature value of the shunt resistor calculated based on the calculated heating value and a thermal resistance coefficient of the shunt resistor and (ii) the ambient temperature value of the shunt resistor; and calculating, by a resistance calculating unit, a second resistance value of the shunt resistor based on the calculated change amount of the final temperature value and a temperature coefficient value of the shunt resistor.

In the exemplary embodiment, calculating the current value of the shunt resistor may be based on:

$$I=V/R$$

wherein, I is the current value of the shunt resistor, V is the voltage value of the shunt resistor, and R is the first resistance value of the shunt resistor.

In the exemplary embodiment, calculating the heating value of the shunt resistor may be based on:

$$E=\int_0^1 (I^2 * R)dt$$

wherein, E is the heating value of the shunt resistor, I is the current value of the shunt resistor, R is the first resistance value of the shunt resistor, and t is a flowing time value of a current flowing in the shunt resistor.

In the exemplary embodiment, the temperature sensor may be positioned adjacent to the shunt resistor.

In the exemplary embodiment, calculating change amount of the final temperature value may be based on:

$$T(E*a)+T_a-T_i$$

(wherein, T is the change amount of the final temperature value, E is the heating value of the shunt resistor, a is the thermal resistance coefficient of the shunt resistor, $T_a$ is the ambient temperature of the shunt resistor, and $T_i$ is the initial temperature value of the shunt resistor.

In the exemplary embodiment, calculating the second resistance value of the shunt resistor may be based on:

$$R=R_i+(T*b)$$

wherein, R is the second resistance value of the shunt resistor, $R_i$ is the first resistance value of the shunt resistor, T is the change amount of the final temperature value, and b is the temperature coefficient of the shunt resistor.

In an exemplary embodiment, the method may further include changing, by the current calculating unit, the first resistance value to the second resistance value provided from the resistance calculating unit.

Advantageous Effects

The system and the method for correcting a current value of a shunt resistor according to the exemplary embodiment of the present invention calculate a change amount of a resistance value by using a variable temperature value of a shunt resistor and calculate a real-time current value flowing in the corresponding shunt resistor based on the calculated change amount of the resistance value and voltage values of both terminals of the shunt resistor, so that even though the temperature value of the shunt resistor is continuously changed, an accurate current value may be obtained by reflecting all the changes.

BRIEF DESCRIPTION OF THE DRAWINGS

FIG. 1 is a diagram illustrating a configuration of a system 100 for correcting a current value of a shunt resistor according to an exemplary embodiment of the present invention.

FIG. 2 is a flowchart for describing a process of correcting a current value through the system 100 for correcting a current value of a shunt resistor according to the exemplary embodiment of the present invention.

DETAILED DESCRIPTION

Hereinafter, an exemplary embodiment is presented for helping understanding of the present invention. However, the exemplary embodiment below is simply provided for easier understanding of the present invention, and the contents of the present invention are not limited by the exemplary embodiment.

FIG. 1 is a diagram illustrating a configuration of a system 100 for correcting a current value of a shunt resistor according to an exemplary embodiment of the present invention.

Referring to FIG. 1, the system 100 for correcting a current value of a shunt resistor according to an exemplary embodiment of the present invention may include a voltage measuring unit 101 electrically connected with a shunt resistor 10, a current calculating unit 102, a power calculating unit 103, a temperature measuring unit 104, a final temperature value calculating unit 105, and a resistance calculating unit 106.

First, the voltage measuring unit 101 may be connected with both terminals of the shunt resistor 10 provided in a circuit and detect a voltage value of the shunt resistor 10 when a voltage drops due to a flow of a current in the shunt resistor 10.

Next, the current calculating unit 102 may calculate a current value flowing in the shunt resistor 10 based on the detected voltage value and a first resistance value of the shunt resistor 10, and change the first resistance value to a second resistance value provided from the resistance calculating unit 106 which is to be described below.

Herein, the first resistance value may mean the resistance value of the shunt resistor 10 itself.

Further, the second resistance value is a changed resistance value of the shunt resistor 10, and may mean a value of the shunt resistor 10 calculated from the resistance calculating unit 106 which is to be described below.

Further, the current calculating unit 102 may determine a value calculated by Equation 1 below as a current value flowing in the shunt resistor 10.

$$I=V/R \qquad \text{[Equation 1]}$$

(Herein, I is a current value for the shunt resistor, V is a voltage value for the shunt resistor, and R is the first resistance value of the shunt resistor.)

Herein, the first resistance value is changed to the second resistance value calculated by the resistance calculating unit 106 which is to be described below, so that values of I and V may be changed.

Next, the power calculating unit 103 may calculate power consumption and a heating value for the shunt resistor 10 based on the calculated current value and resistance value.

Herein, the power calculating unit 103 may determine a value calculated by Equation 2 below as a heating value of the shunt resistor.

$$E=\int_0^1 (I^2 * R)dt$$

(Herein, E is a heating value of the shunt resistor, I is a current value for the shunt resistor, R is the first resistance value of the shunt resistor, and t is a flowing time value of a current flowing in the shunt resistor.)

Herein, $I^2*R$ is power consumption of the shunt resistor 10, and when $I^2*R$ (is integrated by a flowing time of a current flowing in the shunt resistor 10, a heating value of the shunt resistor 10 may be calculated.

Next, the temperature measuring unit 104 may measure an ambient temperature value of the shunt resistor 10, and transmit the measured ambient temperature value to the final temperature value calculating unit 105.

Herein, the ambient temperature is a temperature of a medium adjacent to a device, and may mean an atmospheric temperature in a normal case.

Next, the final temperature value calculating unit 105 may calculate a second final temperature value of the shunt resistor 10, and a change amount of the second final temperature value compared to the first final temperature value before the flowing of the current based on the heating temperature value of the shunt resistor 10 calculated based on the calculated heating value and a thermal resistance coefficient of the shunt resistor 10 and the ambient temperature value (transmitted from the temperature measuring unit 104) of the shunt resistor 10, and calculate the second final temperature value and the final temperature value change amount of the shunt resistor and then change the first final temperature value to the second final temperature value.

Herein, the first final temperature value is a temperature value obtained by summing the heating temperature value and the ambient temperature value of the shunt resistor 10, and may mean the final temperature value of the shunt resistor 10 before a current flows in the shunt resistor 10.

Further, the second final temperature value is a temperature value obtained by summing the heating temperature value and the ambient temperature value of the shunt resistor 10, and mean the temperature value of the shunt resistor 10 calculated from the final temperature value calculating unit 105.

Further, the final temperature value calculating unit 105 may determine a value calculated by Equation 3 below as the second final temperature value and the final temperature value change amount of the shunt resistor.

$$T=(E*a)+T_a-T_i$$

(Herein, T is the final temperature value change amount of the shunt resistor, E is a heating value of the shunt resistor, a is a thermal resistance coefficient of the shunt resistor, $T_a$ is an ambient temperature of the shunt resistor, and $T_i$ is the first final temperature value of the shunt resistor.)

Herein, $E*a$ is a heating temperature value of the shunt resistor 10, and when the heating temperature value is added to the ambient temperature of the shunt resistor 10, the second final temperature value of the shunt resistor 10 is calculated, and a difference between the second final temperature value and the first final temperature value may mean a final temperature value change amount.

Further, the thermal resistance coefficient of the shunt resistor 10 may refer to a degree of intrinsic property that is intended to interfere with heat transfer to the material constituting the shunt resistor 10.

Next, the resistance calculating unit 106 may calculate the second resistance value of the shunt resistor 10 based on the change amount of the second final temperature value compared to the first final temperature value of the shunt resistor 10 before the flow of the current, and the temperature coefficient value of the shunt resistor 10 changed according to a change in a temperature.

Further, the resistance calculating unit 106 may determine a value calculated by Equation 4 below as a second resistance value of the shunt resistor 10.

$$R=R_i+(T*b)$$

(Herein, R is the second resistance value of the shunt resistor, $R_i$ is the first resistance value of the shunt resistor, T is the final temperature value change amount value of the shunt resistor, and b is a temperature coefficient of the shunt resistor.)

Herein, $T*b$ is a resistance value by the change of the shunt resistor 10, and when the value is added to the first resistance value of the shunt resistor 10, the second resistance value of the shunt resistor 10 may be calculated.

Herein, the temperature coefficient of the shunt resistor 10 may refer to the degree of the change of the shunt resistor 10 according to a temperature change.

Next, a process of correcting a current through the system for correcting a current value of a shunt resistor will be described with reference to FIG. 2.

FIG. 2 is a flowchart for describing a process of correcting a current through the system for correcting a current value of a shunt resistor illustrated in FIG. 1.

Referring to FIG. 2, first, the voltage measuring unit measures a voltage value of the shunt resistor (S201), the current calculating unit calculates a current value flowing in the shunt resistor based on the measured voltage value and shunt resistance value (S202), and the power calculating unit calculates power consumption and a heating value of the shunt resistor based on the calculated current value and shunt resistance value (S203), and in this case, the heating value is calculated by a method of integrating the power consumption of the shunt resistor by the time of the flowing of a current in the shunt resistor.

Next, the final temperature calculating unit calculates a second final temperature value and a final temperature value change amount for the shunt resistor based on a heating temperature value of the shunt resistor calculated based on the calculated heating value and a thermal resistance coefficient of the shunt resistor and an ambient temperature value of the shunt resistor (S204), and when the final temperature value change amount is calculated, the final temperature calculating unit provides the resistance calculating unit with the final temperature value change amount and then changes the first final temperature value to the second final temperature value.

Next, the resistance calculating unit calculates a second resistance value of the shunt resistor based on the calculated final temperature value change amount and a temperature coefficient of the shunt resistor (S205), and provides the current calculating unit with the calculated second resistance value to change the first resistance value to the second resistance value (S206).

In the forgoing, the present invention has been described with reference to the exemplary embodiment of the present invention, but those skilled in the art may appreciate that the present invention may be variously corrected and changed within the range without departing from the spirit and the area of the present invention described in the appending claims.

The invention claimed is:

1. A system for correcting a current value of a shunt resistor, the system comprising:
a power calculating unit configured to calculate power consumption and a heating value of a shunt resistor included in a circuit based on a current value for the shunt resistor and a first resistance value of the shunt resistor;

a temperature sensor configured to measure an ambient temperature value of the shunt resistor;

a final temperature value calculating unit configured to calculate (a) a final temperature value for the shunt resistor and (b) a change amount of the final temperature value compared to an initial temperature value before a flow of a current flows through the shunt resistor based on (i) a heating temperature value of the shunt resistor calculated based on the calculated heating value and a thermal resistance coefficient of the shunt resistor and (ii) the ambient temperature value of the shunt resistor; and a resistance calculating unit configured to calculate a second resistance value of the shunt resistor based on the calculated change amount of the final temperature value and a temperature coefficient value of the shunt resistor.

2. The system of claim 1, further comprising:

a voltage sensor configured to detect a voltage value of the shunt resistor when a voltage of the shunt resistor drops; and a current calculating unit configured to calculate a current value for the shunt resistor based on the detected voltage value and the first resistance value of the shunt resistor, wherein the current calculating unit is configured to change the first resistance value to the second resistance value provided from the resistance calculating unit.

3. The system of claim 2, wherein the current calculating unit is configured to calculate the current value using:

$$I=V/R$$

wherein, I is the current value for the shunt resistor, V is the voltage value of the shunt resistor, and R is the first resistance value of the shunt resistor.

4. The system of claim 1, wherein the power calculating unit is configured to calculate the heating value of the shunt resistor using:

$$E=\int_0^1 (I^2 * R) dt$$

wherein, E is the heating value of the shunt resistor, I is the current value of the shunt resistor, R is the first resistance value of the shunt resistor, and t is a flowing time value of a current flowing in the shunt resistor.

5. The system of claim 1, wherein the temperature sensor is positioned adjacent to the shunt resistor.

6. The system of claim 1, wherein the final temperature calculating unit is configured to calculate final temperature value, using:

$$T=(E*a)+T_a-T_i$$

wherein, T is the change amount of the final temperature value, E is the heating value of the shunt resistor, a is the thermal resistance coefficient of the shunt resistor, $T_a$ is the ambient temperature of the shunt resistor, and $T_i$ is the initial temperature value of the shunt resistor.

7. The system of claim 1, wherein the resistance calculating unit is configured to calculate the second resistance value of the shunt resistor using:

$$R=R_i+(T*b)$$

wherein, R is the second resistance value of the shunt resistor, $R_i$ is the first resistance value of the shunt resistor, T is the change amount of the final temperature value, and b is the temperature coefficient of the shunt resistor.

8. A method for correcting a current value of a shunt resistor, the method comprising:

calculating, by a power calculating unit, power consumption and a heating value of a shunt resistor included in a circuit based on a current value for the shunt resistor and a first resistance value of the shunt resistor;

measuring, by a temperature sensor, a real-time ambient temperature of the shunt resistor;

calculating, by a final temperature value calculating unit, (a) a final temperature value for the shunt resistor and (b) a change amount of the final temperature value compared to an initial temperature value before a flow of a current flows through the shunt resistor based on (i) a heating temperature value of the shunt resistor calculated based on the calculated heating value and a thermal resistance coefficient of the shunt resistor and (ii) the ambient temperature value of the shunt resistor; and calculating, by a resistance calculating unit, a second resistance value of the shunt resistor based on the calculated change amount of the final temperature value and a temperature coefficient value of the shunt resistor.

9. The method of claim 8, wherein calculating the current value of the shunt resistor is based on:

$$I=V/R$$

wherein, I is the current value for of the shunt resistor, V is the voltage value for of the shunt resistor, and R is the first resistance value of the shunt resistor.

10. The method of claim 9, further comprising changing, by the current calculating unit, the first resistance value to the second resistance value provided from the resistance calculating unit.

11. The method of claim 8, wherein calculating the heating value of the shunt resistor is based on:

$$E=\int_0^1 (I^2 * R) dt$$

wherein, E is the heating value of the shunt resistor, I is the current value of the shunt resistor, R is the first resistance value of the shunt resistor, and t is a flowing time value of a current flowing in the shunt resistor.

12. The method of claim 8, wherein calculating amount of the final temperature value is based on:

$$T=(E*a)+T_a-T_i$$

wherein, T is the final temperature value change amount of the final temperature value, E is the heating value of the shunt resistor, a is the thermal resistance coefficient of the shunt resistor, $T_a$ is the ambient temperature of the shunt resistor, and $T_i$ is the initial temperature value of the shunt resistor.

13. The method of claim 8, wherein calculating the second resistance value of the shunt resistor is based on:

$$R=R_i+(T*b)$$

wherein, R is the second resistance value of the shunt resistor, $R_i$ is the first resistance value of the shunt resistor, T is the change amount of the final temperature value, and b is the temperature coefficient of the shunt resistor.

* * * * *